(12) United States Patent
Pei et al.

(10) Patent No.: US 10,103,219 B2
(45) Date of Patent: Oct. 16, 2018

(54) POWER SEMICONDUCTOR DEVICE AND METHOD FOR MANUFACTURING THE SAME

(71) Applicant: Gpower Semiconductor, Inc., Suzhou (CN)

(72) Inventors: Yi Pei, Suzhou (CN); Yuan Li, Suzhou (CN); Chuanjia Wu, Suzhou (CN)

(73) Assignee: Gpower Semiconductor, Inc., Suzhou (CN)

( * ) Notice: Subject to any disclaimer, the term of this patent is extended or adjusted under 35 U.S.C. 154(b) by 23 days.

(21) Appl. No.: 15/473,572

(22) Filed: Mar. 29, 2017

(65) Prior Publication Data
US 2017/0207300 A1    Jul. 20, 2017

Related U.S. Application Data

(63) Continuation of application No. PCT/CN2015/077097, filed on Apr. 21, 2015.

(30) Foreign Application Priority Data

Sep. 30, 2014    (CN) .......................... 2014 1 0521547

(51) Int. Cl.
| | |
|---|---|
| *H01L 29/06* | (2006.01) |
| *H01L 29/778* | (2006.01) |
| *H01L 29/205* | (2006.01) |
| *H01L 29/20* | (2006.01) |
| *H01L 29/66* | (2006.01) |
| *H01L 21/3065* | (2006.01) |
| *H01L 21/308* | (2006.01) |

(52) U.S. Cl.
CPC ...... *H01L 29/0607* (2013.01); *H01L 21/3065* (2013.01); *H01L 21/3086* (2013.01); *H01L 29/0684* (2013.01); *H01L 29/2003* (2013.01); *H01L 29/205* (2013.01); *H01L 29/66462* (2013.01); *H01L 29/7786* (2013.01)

(58) Field of Classification Search
None
See application file for complete search history.

(56) References Cited

U.S. PATENT DOCUMENTS

2013/0082277 A1*    4/2013   Park .................. H01L 29/41725
257/76

* cited by examiner

*Primary Examiner* — Michelle Mandala
(74) *Attorney, Agent, or Firm* — Flener IP & Business Law; Zareefa B. Flener

(57) ABSTRACT

The present disclosure discloses a power semiconductor device and a method for manufacturing the same. The power semiconductor device comprises: a substrate, a channel layer, a barrier layer, a source electrode, a drain electrode, a gate electrode, and a junction termination structure located on the barrier layer. The power semiconductor device extends in a first direction from an edge of a side of the gate electrode close to the drain electrode to the drain electrode, the junction termination structure at least comprises a first region close to the gate electrode and a second region away from the gate electrode and the thickness of the first region is greater than that of the second region in a second direction perpendicular to the barrier layer. The junction termination structure can effectively improve the distribution of an electric field of the barrier layer and hence increase the breakdown voltage of the device.

20 Claims, 7 Drawing Sheets

POWER SEMICONDUCTOR DEVICE AND METHOD FOR MANUFACTURING THE SAME

CROSS-REFERENCE TO RELATED APPLICATIONS

This application is a continuation of international application No. PCT/CN2015/077097 filed on Apr. 21, 2015, which claims the benefit and priority of Chinese patent application No. 201410521547.6, filed on Sep. 30, 2014, entitled "POWER SEMICONDUCTOR DEVICE AND METHOD FOR MANUFACTURING THE SAME". Both applications are incorporated herein in their entirety by reference.

TECHNICAL FIELD

The present disclosure relates to the technical field of semiconductors, and in particular to a power semiconductor device and a method for manufacturing the same.

BACKGROUND

The third-generation semiconductor material GaN has great prospect of application at high temperature and under high voltage due to its high breakdown field strength (greater than 3 MV/cm) and large band gap (3.4 eV at room temperature). Meanwhile, because III-V compound semiconductors have strong spontaneous polarization and piezoelectric polarization effects, two dimensional electron gas (2DEG) channel having a high electron concentration and high electron mobility can be formed in the vicinity of an interface of heterojunctions. Thus, GaN is particularly applicable to high-voltage, high-current, high-temperature, high-speed and high-power devices.

However, in a GaN high electron mobility transistor (HEMT), only 20%-30% of the theoretical voltage withstanding value can be reached, because the electric field will concentrate at an edge of the gate electrode close to the drain electrode when a high voltage is applied to the drain electrode. Therefore, in a GaN HEMT, the breakdown of device usually occurs at an edge of a side of the gate electrode close to the drain electrode.

It is a common method to reduce the electric field peak by using a field plate structure. Generally, an insulating dielectric layer is deposited at the gate electrode first; and then a metal field plate layer is deposited, with the field plate being connected to the gate electrode or the source electrode, and the field plate having a fixed potential. The equipotential of the field plate can adjust power lines at the edge of the gate electrode, so that the gradient of potential becomes flat. In this way, the electric field strength which would have reached the breakdown limit of the material at the edge of the gate electrode is decreased, and the peak is absorbed to the edge of the field plate. This is equivalent to the expansion of the depletion region. The breakdown voltage is much higher since the integral of the electric field is the breakdown voltage. The optimal result of modulating the electric field by using field plates is to allow for an approximately rectangular distribution curve of the electric field. In this way, the integral area of the electric field strength to the distance can be maximized, so that the breakdown voltage of devices can be maximized.

However, the field plate structure will introduce a new electric field peak at the edge close to the drain electrode. Because electric field concentration effect exists at the edge of the field plate electrode as well, the dielectric breakdown at the edge of the field plate is another way resulting in device breakdown. Therefore, during the practical use of the field plate structure, it is necessary to take into consideration the dielectric breakdown of the insulating dielectric in the field plate structure. In addition, the dielectric layer will introduce a capacitance, thereby decreasing the switching speed of the switch in the device and increasing the power loss. Therefore, it is urgent for the skilled in the art to seek for a new field plate technology to increase the breakdown voltage of devices.

SUMMARY

Accordingly, the present disclosure proposes a power semiconductor device having a junction termination structure and a method for manufacturing the same.

The junction termination is made of semiconductor material which may be AlGaN having a constant content of Al element, AlGaN having a gradually-changing content of Al element, InAlN having a constant content of In element, InAlN having a gradually-changing content of In element, n-type GaN or p-type GaN. The junction termination structure extends toward a drain electrode from an edge of a side of a gate electrode close to the drain electrode, and has a thickness which, for example, can be progressively decreased in a direction from the gate electrode to the drain electrode.

In some embodiments, piezoelectric negative charges are generated in the junction termination, and the resulting polarized electric field may decrease the concentration of the 2DEG at an interface between a barrier layer and a channel layer. In an embodiment in which the junction termination structure has a changing thickness, the degree of depletion of the 2DEG gradually changes as the thickness of the junction termination changes. Where the junction termination has a large thickness, the strength of the polarized electric field is high and the degree of depletion of the 2DEG is high as well. As the thickness of the junction termination decreases, the degree of depletion of the 2DEG decreases. In some embodiments of the present disclosure, at the whole interface between the barrier layer and the channel layer, formed is a structure in which the degree of depletion of the 2DEG below the junction termination gradually changes while a high concentration of 2DEG is kept unchanged in other parts.

For an HEMT device using such a junction termination structure, when an external voltage is applied to the drain electrode of the device, the junction termination can adjust the distribution of the electric field on the surface of the barrier layer of the device. In an embodiment in which the thickness of the junction termination structure progressively decreases from where close to the gate electrode to where away from the gate electrode, since the junction termination has the largest thickness at an edge close to the gate electrode and the degree of depletion of the 2DEG is greatest, the electric field peak here is maximally inhibited. Meanwhile, since the thickness of the junction termination gradually decreases toward the drain electrode, the degree of depletion of the 2DEG toward the drain electrode gradually decreases and eventually returns to the original concentration of 2DEG. Therefore, the electric field lines at the edge of the terminal will not be suddenly increased to be very dense, so that a new electric field peak will not be introduced to the edge of the terminal. The electric field on the surface of the barrier layer between the gate electrode and the drain electrode experiences a smooth transition within a larger range, and voltages withstood by semiconductors in the barrier layer between the source electrode and the drain electrode are approximate to each other. Accordingly, the breakdown voltage of the device is increased.

To achieve the above purposes, the embodiments of the present disclosure provide the following technical solutions.

A power semiconductor device is provided, comprising: a substrate; a channel layer provided on the substrate; a barrier layer located on the channel layer; a source electrode, a drain electrode and a gate electrode all located on the barrier layer, the gate electrode being located between the source electrode and the drain electrode; and a junction termination structure located on the barrier layer, wherein the junction termination structure extends in a first direction from an edge of a side of the gate electrode close to the drain electrode to the drain electrode, the junction termination structure at least comprises a first region close to the gate electrode and a second region away from the gate electrode, and the thickness of the first region is greater than that of the second region in a second direction perpendicular to the barrier layer. That is, two regions can be found on the surface of the junction termination structure away from the barrier layer, which are respectively the first region close to the gate electrode and the second region close to the drain electrode (namely, away from the gate electrode). The thickness of the first region is larger than that of the second region (thickness in the dimension of the junction termination structure in the direction perpendicular to the barrier layer).

As a further improvement of the present disclosure, a thickness of the junction termination structure progressively decreases in the first direction.

As a further improvement of the present disclosure, a lattice constant of the junction termination structure is greater than that of the barrier layer. As a further improvement of the present disclosure, a surface of a side of the junction termination structure away from the barrier layer is a slanted plane.

As a further improvement of the present disclosure, a surface of a side of the junction termination structure away from the barrier layer is a curved plane.

As a further improvement of the present disclosure, a surface of a side of the junction termination structure away from the barrier layer is a curved plane recessed toward the barrier layer or a curved plane protruded toward a direction away from the barrier layer.

As a further improvement of the present disclosure, a thickness of the junction termination structure progressively decreases in the first direction, and a side of the junction termination structure away from the barrier layer at least comprises one transition step by which the junction termination structure is decreased to a second thickness from a first thickness.

As a further improvement of the present disclosure, a surface of a side of the junction termination structure away from the barrier layer is at least one of a slanted plane and a curved plane.

As a further improvement of the present disclosure, the barrier layer is made of AlGaN; and the junction termination structure is any one of an AlGaN layer having a constant content of Al element, an AlGaN layer having a content of Al element progressively decreased from an interface between the junction termination structure and the barrier layer to a surface of the junction termination structure away from the barrier layer, a n-type GaN layer and a p-type GaN layer.

As a further improvement of the present disclosure, the barrier layer is made of InAlN; and the junction termination structure is any one of an InAlN layer having a constant content of In element, an InAlN layer having a content of In element progressively increased from an interface between the junction termination structure and the barrier layer to a surface of the junction termination structure away from the barrier layer, a n-type GaN layer and a p-type GaN layer.

As a further improvement of the present disclosure, a groove is provided in a partial region on a side of the barrier layer away from the substrate, at least a partial region of the gate electrode is located above the groove, and a gate electrode metal is filled within the groove.

As a further improvement of the present disclosure, the junction termination structure further comprises a gate electrode metal field plate which is provided above at least a partial region of the gate electrode and at least a partial region of the junction termination structure, the gate electrode and the junction termination structure being connected by the gate electrode metal field plate.

As a further improvement of the present disclosure, the junction termination structure further comprises a source electrode metal field plate which is provided above at least a partial region of the source electrode and at least a partial region of the junction termination structure, the source electrode and the junction termination structure being connected by the source electrode metal field plate, and an air bridge or a dielectric bridge being formed below the source electrode metal field plate.

As a further improvement of the present disclosure, a partial region of the junction termination structure is located below the gate electrode.

As a further improvement of the present disclosure, the power semiconductor device further comprises a capping layer provided above the barrier layer, the gate electrode is located above the capping layer, and the junction termination structure extends toward the drain electrode from a side of the capping layer away from the source electrode.

Correspondingly, a method for manufacturing a power semiconductor device is provided, comprising: providing a substrate; forming a channel layer on the substrate; forming a barrier layer on the channel layer; and forming a source electrode, a drain electrode, a gate electrode and a junction termination structure on the barrier layer, the gate electrode being located between the source electrode and the drain electrode, the junction termination structure at least comprising a first region close to the gate electrode and a second region away from the gate electrode, and a thickness of the first region being greater than that of the second region in a second direction perpendicular to the barrier layer.

As a further improvement of the present disclosure, a lattice constant of the junction termination structure is greater than that of the barrier layer.

As a further improvement of the present disclosure, forming a junction termination structure on the barrier layer specifically comprises: depositing a junction termination layer on the barrier layer and forming a photoresist layer on the junction termination layer; and photolithographing and developing the photoresist layer by using a mask having a variable-density lattice, and then performing dry-etching to remove part of the junction termination layer so as to form the junction termination structure.

As a further improvement of the present disclosure, the method further comprising gradually increasing an exposure degree of the mask in the first direction to obtain a junction termination structure having a thickness progressively decreased in the first direction.

As a further improvement of the present disclosure, forming a junction termination structure on the barrier layer specifically comprises: depositing a junction termination layer on the barrier layer and forming a photoresist layer on the junction termination layer; and photolithographing and developing the photoresist layer by using a mask, and then performing dry-etching to remove a part of the junction termination layer; and reducing a width of an exposure window, and repeating the steps of photolithographing and developing the photoresist layer by using the mask and the step of dry-etching to remove a part of the junction termination layer until a junction termination structure is formed.

The junction termination structure according to some embodiments of the present disclosure can effectively improve the distribution of an electric field of the barrier layer and hence increase the breakdown voltage of the device.

BRIEF DESCRIPTION OF DRAWINGS

To describe the technical solutions in the embodiments of the present disclosure or in the prior art more clearly, drawings to be used in the description of the embodiments or the prior art will be briefly introduced below. Apparently, the drawings to be described below are merely some embodiments of the present disclosure. Other drawings may be obtained by a person of ordinary skill in the art according to those drawings without any creative effort. In the drawings.

DETAILED DESCRIPTION

Figure 1:
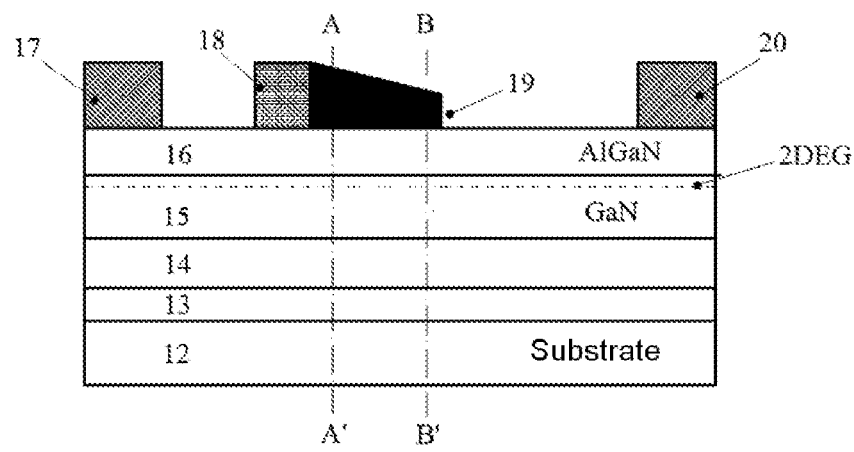
FIG. 1 is a structure diagram of an HEMT using a planar junction termination structure according to a first embodiment of the present disclosure.

The present disclosure will be described in detail by specific implementations illustrated in the drawings. However, those implementations are not intended to limit the present disclosure. Any structures, methods or functional transformations made by a person of ordinary skill in the art according to those implementations shall be included within the protection scope of the present disclosure.

Here, in different embodiments, repeated numbers or signs may be used. Those repetitions are only intended to describe the present disclosure simply and clearly, and do not imply that the different embodiments or structures discussed here have any association.

FIG. 1 is a structure diagram of an HEMT using a planar junction termination structure according to a first embodiment of the present disclosure. It is to be noted that the planar junction termination structure in this embodiment of the present disclosure means that a surface of a side of the junction termination structure away from the barrier layer is a flat plane.

This HEMT specifically comprises: a substrate 12 which may be made of Si, sapphire, SiC or other material; a nucleation layer 13 and a buffer layer 14 sequentially epitaxially grown on the substrate 12; a channel layer 15 grown on the buffer layer 14; a barrier layer 16 grown on the channel layer 15; a source electrode 17, a drain electrode 20 and a gate electrode 18 provided on the barrier layer 16, the gate electrode 18 being disposed between the source electrode 17 and the drain electrode 20; and a junction termination structure 19 formed at an edge of the gate electrode 18 close to the drain electrode 20.

The nucleation layer 13 and the buffer layer 14 may comprise GaN or AlN or other nitrides. The nucleation layer 13 and the buffer layer 14 may have a function of matching the substrate 12 and the channel layer 15, and could exert influences on parameters such as crystalline quality, surface topography and electrical properties of a heterojunction formed by the channel layer 15 and the barrier layer 16.

The channel layer 15 may contain a non-doped GaN layer. The barrier layer 16 may contain AlGaN or other nitrides. The channel layer 15 and the barrier layer 16 together form a semiconductor heterojunction structure. High-concentration 2DEG is formed at an interface between the channel layer 15 and the barrier layer 16, and a conducting channel is formed at an interface of the heterojunction in the GaN channel layer 15.

The source electrode 17 and the drain electrode 20 form an ohmic contact with the barrier layer 16, and the ohmic metal may be one or any combination of Ni, Ti, Al, Au or the like. The gate electrode 18 and the barrier layer 16 form a schottky contact.

In the embodiment illustrated in FIG. 1, the junction termination structure 19 has a thickness which progressively decreases in a direction from the edge of the gate electrode 18 to the drain electrode 20. When the barrier layer 16 is made of AlGaN, the junction termination structure 19 in this embodiment may also be made of AlGaN, and a content of Al element in the junction termination structure 19 is less than that in the barrier layer 16.

Since a content of Al element in the junction termination structure 19 is less than that in the barrier layer 16, a lattice constant of the junction termination structure 19 is greater than that of the barrier layer 16. Accordingly, a compressive stress is introduced to the interface between them. Because AlGaN has a very large piezoelectric polarization coefficient, the resulting polarization field is very strong. In addition, AlGaN also has a spontaneous polarization effect. Due to both the piezoelectric effect and the spontaneous polarization effect, piezoelectric negative charges are generated in the junction termination structure 19. The piezoelectric negative charges will deplete the 2DEG at the interface between the barrier layer 16 and the channel layer 15 below the junction termination structure 19.

Figure 2A:
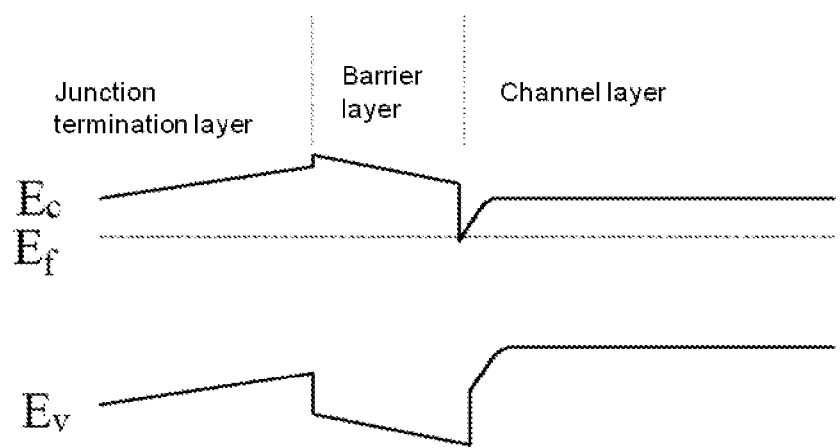
FIG. 2a is a schematic diagram of an energy band at A-A' of FIG. 1.
Figure 2B:
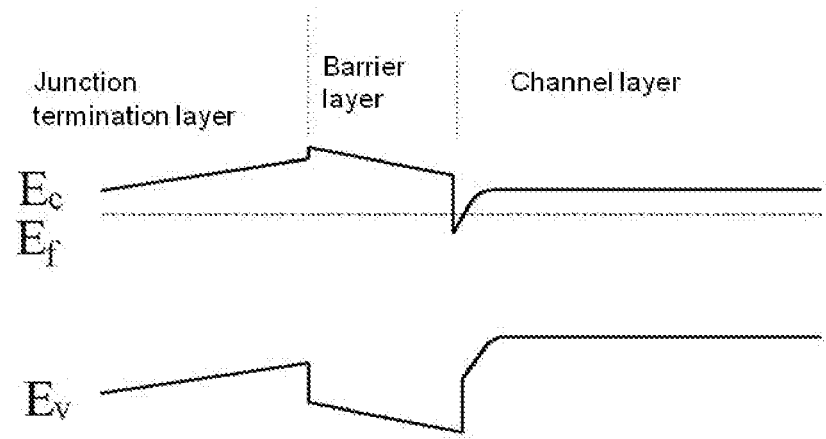
FIG. 2b is a schematic diagram of an energy band at B-B' of FIG. 1.

For a semiconductor junction termination structure, more piezoelectric negative charges are generated in a portion of the junction termination having a larger thickness, such that much 2DEG is depleted here, as illustrated in the schematic diagram of the energy band at A-A' of FIG. 2a. Less 2DEG is depleted in a portion of the junction termination having a smaller thickness, as illustrated in the schematic diagram of the energy band at B-B' of FIG. 2b.Compared with the energy band at A-A' of FIG. 1, the Fermi level moves upward in FIG. 2b and is therefore closer to the bottom of the GaN conduction band. Thus, the concentration of 2DEG is higher here. From a portion of the junction termination structure having the smallest thickness to a portion of the junction termination structure having the largest thickness, the concentration of 2DEG below the junction termination structure gradually decreases. In the portion of the junction termination structure having the largest thickness, i.e., a portion of the gate electrode close to the drain electrode, the depletion of the 2DEG is highest. Therefore, the reduction of the electric field peak here by the junction termination structure is most significant. Meanwhile, as the thickness of the junction termination structure decreases, the depletion of the 2DEG by the junction termination structure will decrease accordingly. Therefore, alow channel on-resistance is maintained, and the electric field strength is modulated as well.

In this embodiment, a method for manufacturing an HEMT structure specifically comprises the steps of: first, providing a substrate 12; successively growing a nucleation layer 13, a buffer layer 14, a channel layer 15 and a barrier layer 16 on the substrate 12; and forming, on the barrier layer 16, a source electrode 17, a drain electrode 20, a gate electrode 18 located between the source electrode 17 and the drain electrode 20, and a junction termination structure 19. The channel layer 15 may be made of GaN, and the barrier layer 16 may be made of AlGaN.

The method for manufacturing this junction termination structure will be described below in more detail. The following description is given in the assumption that both the barrier layer 16 and the junction termination structure 19 are made of AlGaN.

First, an AlGaN junction termination layer is deposited on an AlGaN barrier layer.

Figure 3:
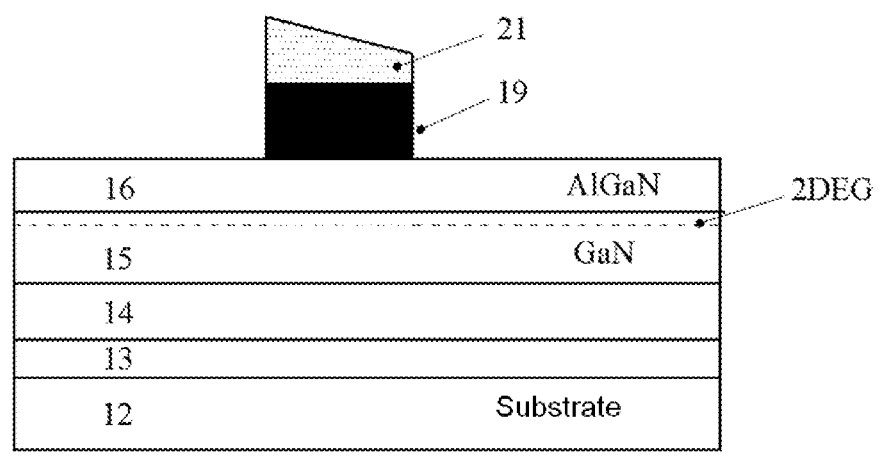
FIG. 3 is a flowchart of a method for preparing an HEMT using a planar junction termination structure according to the first embodiment of the present disclosure.

The junction termination layer is processed by photolithography using a photoresist. The junction termination layer is photolithographed by using a specially designed mask. A mask design by which the exposure of the junction termination is gradually increased in a direction from the gate electrode to a side away from the gate electrode is formed by adjusting the density of a light-shielding dot array. After developing, a photoresist layer 21 which has a thickness progressively decreased in a direction from the gate electrode to the drain electrode is formed, as illustrated in FIG. 3.

Then, the photolithographed region is etched by dry-etching, and by optimizing the etching selection ratio of the photoresist and the AlGaN junction termination layer (for example, 1:1), a planar junction termination structure having a desired slope region is formed on the barrier layer 16, as illustrated in FIG. 1. A gate electrode, a source electrode and a drain electrode may also be formed on the barrier layer. Finally, a passivation layer may also be provided. The passivation layer may be made of SiC, AlO, HfO or the like. The passivated HEMT can decrease the surface-state density of the device, and the current collapse effect of the HEMT can be inhibited.

As another implementation of the present disclosure, the junction termination structure 19 may also be made of AlGaN having a content of Al element which gradually decreases in gradient from the interface between the junction termination structure 19 and the barrier layer 16 to the surface of the junction termination structure 19. The content of Al element in the junction termination structure 19 is highest at the interface between the junction termination structure 19 and the barrier layer 16 but still less than the content of Al element in the barrier layer 16. In addition, the junction termination structure 19 may also be made of n-type GaN or p-type GaN or the like.

As still another implementation of the present disclosure, the barrier layer 16 may also be made of InAlN, and the corresponding junction termination structure 19 may be made of InAlN. In this case, the content of In element in the junction termination structure 19 is greater than that in the barrier layer 16. In addition, when the barrier layer 16 is made of InAlN, the corresponding junction termination structure 19 may also be made of InAlN having a content of In element which gradually increases in gradient from the interface between the junction termination structure 19 and the barrier layer 16 to the surface of the junction termination structure 19. The content of In element in the junction termination structure 19 is minimum at the interface between the junction termination structure 19 and the barrier layer 16 but greater than or equal to the content of In element in the barrier layer 16. In addition, the junction termination structure 19 may also be made of n-type GaN or p-type GaN or the like.

Figure 4:
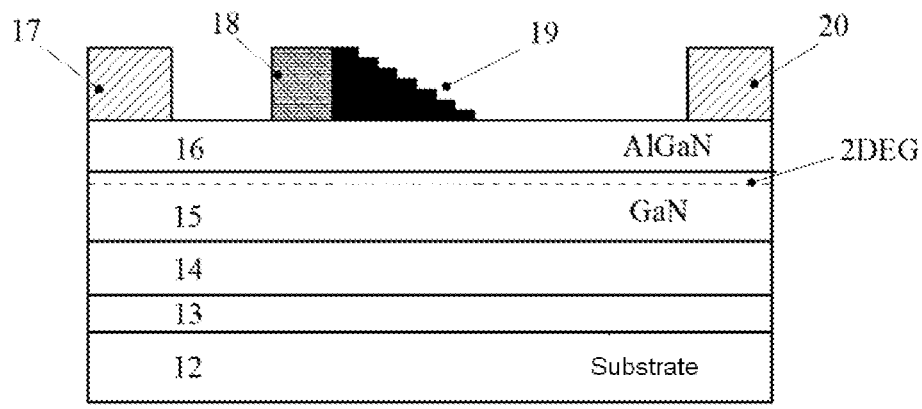
FIG. 4 is a structure diagram of an HEMT using a stepped junction termination structure according to a second embodiment of the present disclosure.

FIG. 4 is a structure diagram of an HEMT using a stepped junction terminal structure according to a second embodiment of the present disclosure. It is to be noted that the stepped junction terminal structure in this embodiment of the present disclosure means that a surface of a side of the junction termination structure away from the barrier layer is step-shaped, that is, the surface comprises at least one transition step.

In this implementation, the junction termination structure 19 is a stepped structure, and the remaining is the same as that in the first embodiment. Both the barrier layer 16 and the junction termination structure 19 may be made of AlGaN, and the content of Al element in the junction termination structure 19 is less than that in the barrier layer 16. The junction termination structure 19 plays a same role as that in the first embodiment. The depletion of the 2DEG at the interface between the barrier layer 16 and the channel layer 15 by the junction termination structure 19 gradually changes, so that the modulation of the electric field gradually changes.

The junction termination structure in this implementation may also be made of AlGaN having a content of Al element which gradually decreases in gradient from the interface between the junction termination structure 19 and the barrier layer 16 to the surface of the junction termination structure 19, and the content of Al element in the junction termination structure 19 is highest at the interface between the junction termination structure 19 and the barrier layer 16 but still less than the content of Al element in the barrier layer 16. In addition, the junction termination structure 19 may also be made of n-type GaN or p-type GaN or the like.

In this implementation, the barrier layer 16 may also be made of InAlN, and the corresponding junction termination structure 19 may be made of InAlN as well. In this case, the content of In element in the junction termination structure 19 is greater than that in the barrier layer 16. In addition, when the barrier layer 16 is made of InAlN, the corresponding junction termination structure 19 may also be made of InAlN having a content of In element which gradually increases in gradient from the interface between the junction termination structure 19 and the barrier layer 16 to the surface of the junction termination structure 19, and the content of In element in the junction termination structure 19 is minimum at the interface between the junction termination structure 19 and the barrier layer 16 but greater than or equal to the content of In element in the barrier layer 16. In addition, the junction termination structure 19 may also be made of n-type GaN or p-type GaN or the like.

Figure 5:
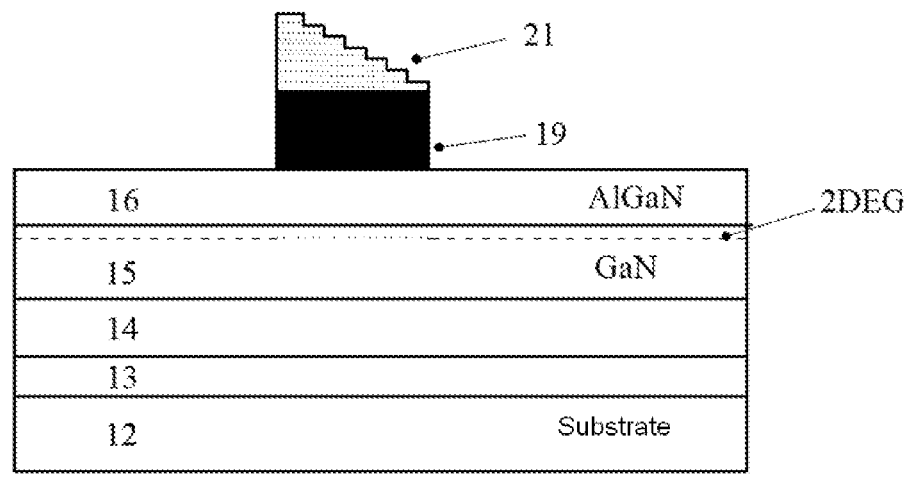
FIG. 5 illustrates a step for preparing the HEMT using a stepped junction termination structure according to the second embodiment of the present disclosure during a preparation process.

The preparation method of this junction termination structure is simpler when compared with the structure having a uniformly changing thickness in the first embodiment. FIG. 5 is a structure diagram of the junction termination structure according to the second embodiment during a preparation process. First, an AlGaN junction termination layer is deposited on a barrier layer 16. Then, the junction termination layer is processed by photolithography by using a photoresist 21. During exposure, by adjusting the density of a light-shielding dot array on a photolithography mask, light passing through the mask is progressively reduced in a direction from the gate electrode to the drain electrode, so that the exposure of the photoresist is progressively reduced. After developing, the photoresist becomes a stepped structure.

Then, the photolithographed region is etched by dry-etching, and by optimizing the etching selection ratio of the photoresist and the AlGaN junction termination layer (for example, 1:1), a desired stepped junction termination structure is formed on the barrier layer. In addition, a gate electrode, a source electrode and a drain electrode are to be formed on the barrier layer 16. Finally, a passivation layer may also be provided.

Compared with the junction termination structure having a continuously changing thickness in the first embodiment, it is easier to design the photolithography mask in this embodiment due to its low requirements on resolution.

Figure 6A:
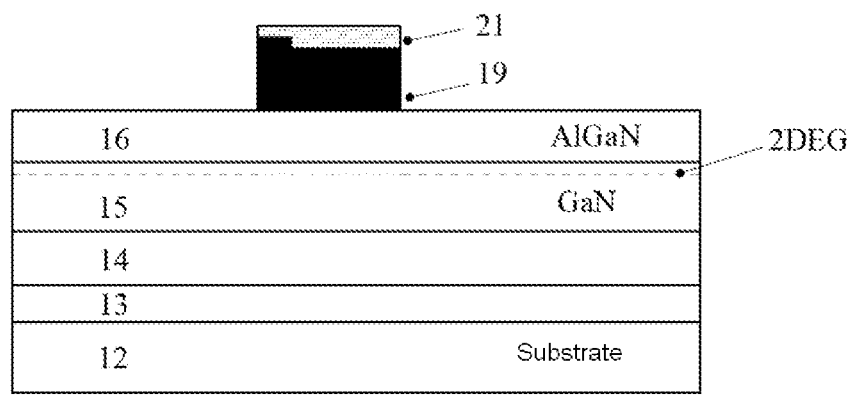
FIG. 6a and FIG. 6b illustrate steps for preparing the HEMT using a stepped junction termination structure according to the second embodiment of the present disclosure during another preparation process.
Figure 6B:
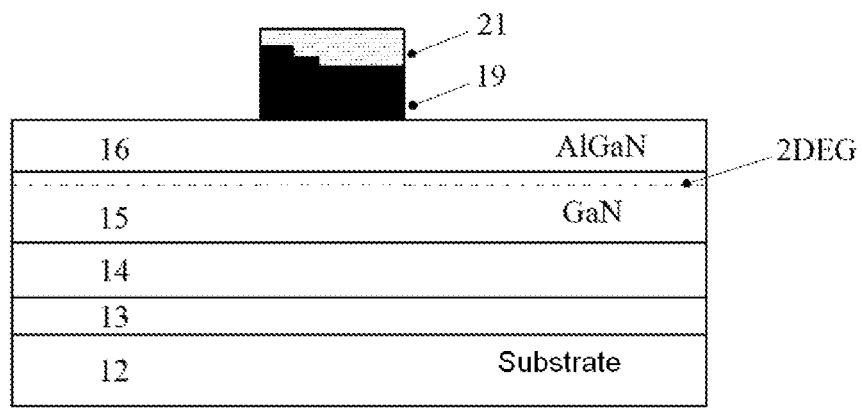

FIG. 6a and FIG. 6b are structure diagrams of the HEMT using a stepped junction terminal structure according to the second embodiment of the present disclosure during another preparation process.

In this embodiment, the preparation is performed by several times of photolithographing. First, the photoresist 21 is coated on the junction termination layer; and then a part of the GaN junction termination layer is removed by exposure, development and then etching, so that a structure as illustrated in FIG. 6a is formed. The above processes are repeated and the width of the exposure window is reduced to form a structure as illustrated in FIG. 6b. The above processes are repeated to form the HEMT device using the stepped junction termination structure as illustrated in FIG. 4.

Figure 7:
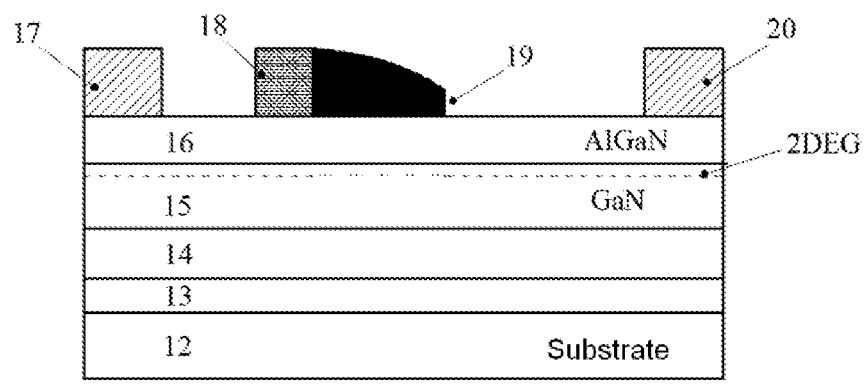
FIG. 7 is a structure diagram of an HEMT using a curved junction termination structure according to a third embodiment of the present disclosure.

The curved junction termination structure according to the third embodiment of the present disclosure, as illustrated in FIG. 7, means that a surface of a side of the junction termination structure away from the barrier layer is a curved surface instead of a flat plane. The curved junction termination structure may have a protruded (protruded toward a direction away from the barrier layer) curved surface or a recessed (recessed toward the barrier layer) curved surface. The curved junction termination structure in the third embodiment is a junction termination structure having a protruded curved surface.

Compared with the first embodiment, the difference of this embodiment lies in that the surface of the junction termination structure 19 is a protruded curved surface. The curved junction termination structure can adjust the distribution of the electric field by adjusting the curvature of the curved surface. Compared with the case in which the planar junction termination structure optimizes the distribution of the electric field by the angle of inclination, the curved junction termination structure in the third embodiment additionally provides a new method for optimizing the distribution of the electric field. Therefore, the characteristics of the device can be further improved.

The method for manufacturing the HEMT structure described in the third embodiment is similar to the method for manufacturing the HEMT structure described in the first embodiment. By designing the density of the light-shielding dot array on the mask, a photoresist with a surface being a protruded curved surface is formed first, and then by etching, a junction termination structure with a surface being a protruded curved surface is formed.

Figure 8:
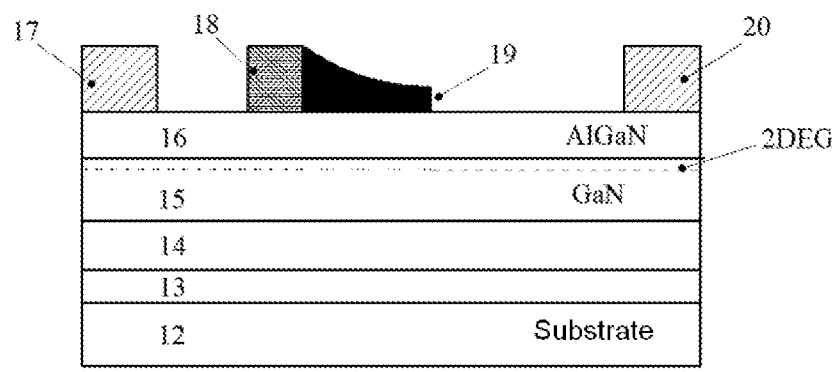
FIG. 8 is a structure diagram of an HEMT using a curved junction termination structure according to a fourth embodiment of the present disclosure.

FIG. 8 is a structure diagram of an HEMT having a recessed curved junction termination structure according to a fourth embodiment of the present disclosure.

Compared with the third embodiment, the difference of this embodiment lies in that the surface of the junction termination structure is a recessed curved surface. The recessed junction termination structure can adjust the distribution of the electric field by adjusting the curvature of the curved surface. Compared with the case in which the planar junction termination structure optimizes the distribution of the electric field by the angle of inclination, the recessed junction termination structure in the third embodiment additionally provides a new method for optimizing the distribution of the electric field. Therefore, the characteristics of the device can be further improved.

The method for manufacturing the HEMT structure described in the fourth embodiment is similar to that for manufacturing the HEMT structure described in the first embodiment. By designing the density of the light-shielding dot array on the mask, a photoresist with a surface being a recessed curved surface is formed first, and then by etching, a junction termination structure with a surface being a recessed curved surface is formed.

Figure 9:
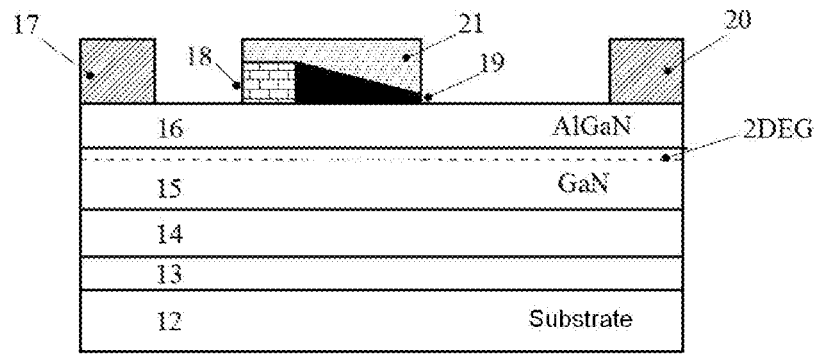
FIG. 9 is a structure diagram of an HEMT having a gate electrode metal field plate and a junction termination structure according to a fifth embodiment of the present disclosure.

FIG. 9 is a structure diagram of an HEMT having a gate electrode metal field plate and a junction terminal structure according to a fifth embodiment of the present disclosure.

Compared with the first embodiment, a gate electrode metal field plate 21 is provided over at least a partial region of the gate electrode 18 and at least a partial region of the junction termination structure 19. The gate electrode 18 and the junction termination structure 19 are connected by the gate electrode metal field plate 21. The gate electrode metal field plate 21 may be made of the same metal material as the gate electrode, and may also be made of other metals that forms ohmic contact with the gate electrode. Due to the use of both the junction termination structure 19 and the gate electrode metal field plate 21, this structure can further inhibit the electric field peak in a portion of the gate electrode close to the drain electrode. Thus, the breakdown voltage of the device is increased. Furthermore, this structure is simple and easily realizable due to non-existence of insulating dielectric layer below the gate electrode metal field plate 21.

Figure 10:
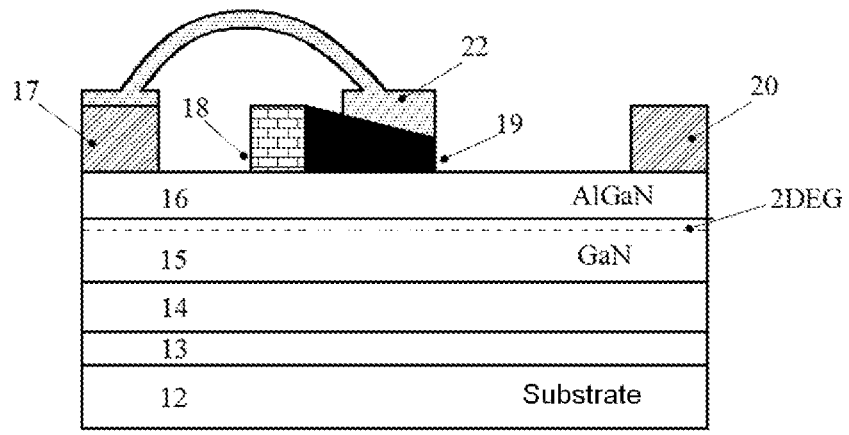
FIG. 10 is a structure diagram of an HEMT having a source electrode metal field plate and a junction termination structure according to a sixth embodiment of the present disclosure.

FIG. 10 is a structure diagram of an HEMT having a source electrode metal field plate and a junction terminal structure according to a sixth embodiment of the present disclosure.

Compared with the first embodiment, a source electrode metal field plate 22 is provided over at least a partial region of the source electrode 17 and at least a partial region of the junction termination structure 19, and the source electrode metal field plate 22 has an air bridge. In this structure, the source electrode 17 and the junction termination structure 19 are connected by the source electrode metal field plate 22 having an air bridge. The source electrode metal field plate 22 may be made of the same metal material as the source electrode, and may also be made of other metals that forms ohmic contact with the source electrode 17. Due to the use of both the junction termination structure 19 and the source electrode metal field plate 22, this structure can further inhibit the electric field peak in a portion of the gate electrode close to the drain electrode. Thus, the breakdown voltage of the device is increased.

Further, in this implementation, an insulating dielectric layer may also be formed wholly or partially below the source electrode metal field plate 22. The source electrode metal field plate 22 forms a dielectric bridge or a combination of a dielectric bridge and an air bridge. This structure can also inhibit the electric field peak in a portion of the gate electrode close to the drain electrode. Thus, the breakdown voltage of the device is increased.

Figure 11:
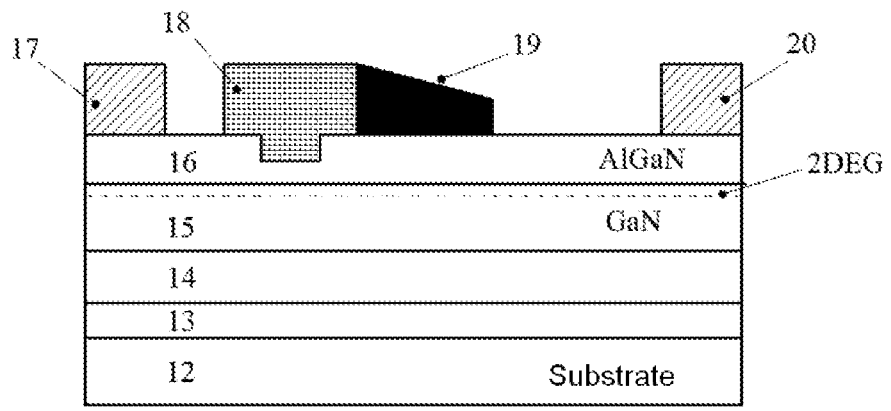
FIG. 11 is a structure diagram of an HEMT using a planar junction termination structure according to a seventh embodiment of the present disclosure.

FIG. 11 is a structure diagram of an HEMT using a planar junction terminal structure according to a seventh embodiment of the present disclosure.

Compared with the first embodiment, the difference of this embodiment lies in that a gate electrode groove is provided within at least a partial region of a side of the barrier layer 16 away from the substrate below the gate electrode 18, and a gate electrode metal is filled within the groove to form a gate electrode downward-extension region. In this embodiment of the present disclosure, the gate electrode metal junction termination structure 19 may be formed at the same time as depositing the gate electrode metal. An enhanced device may be obtained when the 2DEG below the gate electrode 18 is depleted. The gate electrode metal junction termination structure 19 can further reduce the electric field peak at the edge of the gate electrode 18, so that the voltage withstanding performance of the device is enhanced.

Similarly, a groove may be provided in a partial region of the barrier layer 16 in the second to seventh embodiments. Under such a case, the gate electrode comprises a part that is filled in the groove and a part that is formed above the barrier layer 16. The details can be fully understood by those skilled in the art and thus will be omitted herein.

Figure 12:
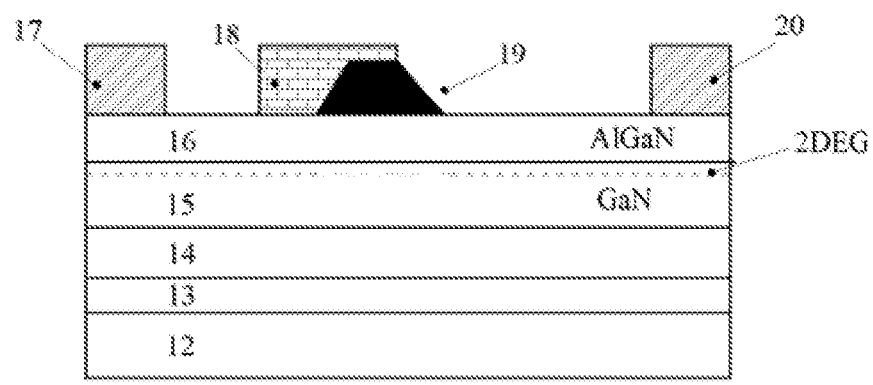
FIG. 12 is a structure diagram of an HEMT using a planar junction termination structure according to an eighth embodiment of the present disclosure.

FIG. 12 is a structure diagram of an HEMT using a planar junction terminal structure according to an eighth embodiment of the present disclosure. Compared with the first embodiment, the difference of this embodiment lies in that a partial region of the junction termination structure 19 can be located below the gate electrode 18. A portion of the gate electrode 18 above the junction termination structure 19 can be regarded as a conventional metal field plate. Meanwhile, the junction termination structure 19 can further reduce the electric field peak at the edge of the gate electrode, so that the voltage withstanding performance of the device is further enhanced.

Similarly, a structure in which a portion of the junction termination is located below the gate electrode may be additionally provided in the second to seventh embodiments. The details can be fully understood by those skilled in the art and thus will be omitted herein.

Figure 13:
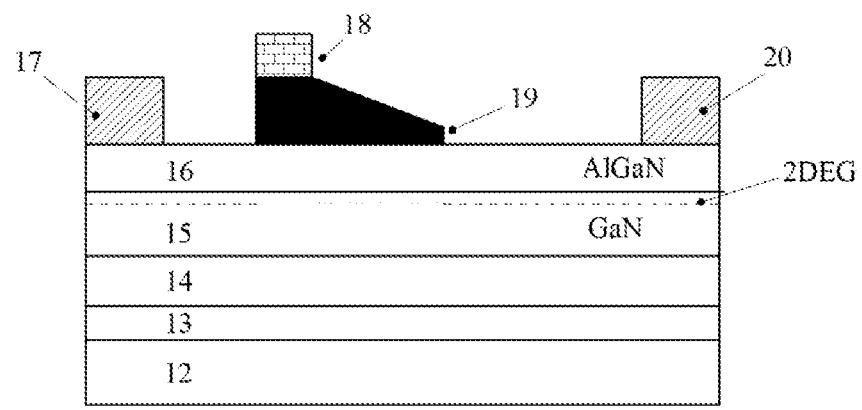
FIG. 13 is a structure diagram of an HEMT using a planar junction termination structure according to a ninth embodiment of the present disclosure.

FIG. 13 is a structure diagram of an HEMT using a planar junction terminal structure according to a ninth embodiment of the present disclosure. Compared with the first embodiment, the difference of this embodiment lies in that a capping layer is provided right below the gate electrode 18. The capping layer may be made of P GaN, P AlGaN or other nitrides. The capping layer can deplete the 2DEG in the channel below the gate electrode so that an enhancement mode HEMT device is obtained. The junction termination structure 19 extends toward the drain electrode 20 from the capping layer, and the thickness thereof continuously decreases. For example, the capping layer may be a portion of the junction termination structure 19. In this case, the capping layer may be made of the same material as the junction termination structure 19. For example, the capping layer may be made of material different from that for the junction termination structure 19. Correspondingly, the capping layer may be formed by a process different from that for the junction termination structure. The junction termination structure 19 can further reduce the electric field peak at the edge of the gate electrode, so that the voltage withstanding performance of the device is enhanced. In this embodiment, the capping layer plays a role of realizing the function of enhancement mode and high device breakdown voltage.

Similarly, a structure in which the gate electrode is completely located above the junction termination structure may be additionally provided in the second to seventh embodiments. The details can be fully understood by those skilled in the art and thus will be omitted herein.

Although the junction termination structure of the present disclosure and its application in GaN-based power semiconductor devices and its manufacturing method have been described in detail by some exemplary embodiments, those embodiments are not exhaustive. For those skilled in the art, various variations can be realized within the spirit and scope of the present disclosure. The junction termination structure is not limited to the above-mentioned three situations, i.e., the planar junction termination structure, the curved junction termination structure and the stepped junction termination structure, and junction termination structures of other shapes or structures also belong to the protection scope of the present disclosure. Correspondingly, the preparations of the junction termination structures are not limited to photolithographing using a density-variable dot array, and many times of photolithographing as described in the above embodiments, and other methods by which the junction termination structure of the present disclosure can be prepared also belong to the protection scope of the present disclosure.

In conclusion, compared with the prior art, the present disclosure has the following advantages.

Due to the piezoelectric effect resulted from the difference in the lattice constant between the junction termination structure and the barrier layer below the junction termination structure, the 2DEG at the interface between the barrier layer and the channel layer is at least partially depleted.

The junction termination structure can effectively improve the distribution of an electric field of the barrier layer and increase the breakdown voltage of the device.

It is apparent for those skilled in the art that the present disclosure is not limited to details of the above exemplary embodiments, and the present disclosure can be embodied in other specific forms without departing from the spirit or essential features of the present disclosure. Therefore, the embodiments shall be considered to be exemplary and non-limiting. The scope of the present disclosure is defined by the appended claims, not by the above descriptions. It is intended to encompass all variations falling into the implication and scope of the equivalences of the claims into the present disclosure. In addition, it should be understood that not every implementation contains only one independent technical solution although the description has been illustrated by implementations. This narration way of the description is only for clarity. Those skilled in the art shall consider the description as a whole. It should be understood by those skilled in the art that the technical solutions in the embodiments may also be combined if appropriate to form other implementations.

What is claimed is:

1. A power semiconductor device, comprising:
   a substrate;
   a channel layer provided on the substrate;
   a barrier layer located on the channel layer;
   a source electrode, a drain electrode and a gate electrode all located on the barrier layer, the gate electrode being located between the source electrode and the drain electrode; and
   a junction termination structure located on the barrier layer,
   wherein the junction termination structure extends in a first direction from an edge of a side of the gate electrode close to the drain electrode to the drain electrode, the junction termination structure at least comprises a first region close to the gate electrode and a second region away from the gate electrode, and the thickness of the first region is greater than that of the second region in a second direction perpendicular to the barrier layer.

2. The power semiconductor device according to claim 1, wherein a thickness of the junction termination structure progressively decreases in the first direction.

3. The power semiconductor device according to claim 1, wherein a lattice constant of the junction termination structure is greater than that of the barrier layer.

4. The power semiconductor device according to claim 1, wherein a surface of a side of the junction termination structure away from the barrier layer is a slanted plane.

5. The power semiconductor device according to claim 1, wherein a surface of a side of the junction termination structure away from the barrier layer is a curved plane.

6. The power semiconductor device according to claim 5, wherein the curved plane is a curved plane recessed towards the barrier layer or a curved plane protruded towards a direction away from the barrier layer.

7. The power semiconductor device according to claim 1, wherein a thickness of the junction termination structure progressively decreases in the first direction, and a side of the junction termination structure away from the barrier layer at least comprises one transition step by which the junction termination structure is decreased to a second thickness from a first thickness.

8. The power semiconductor device according to claim 7, wherein a surface of a side of the junction termination structure away from the barrier layer is at least one of a slanted plane and a curved plane.

9. The power semiconductor device according to claim 1, wherein the barrier layer is made of AlGaN; and the junction termination structure is any one of an AlGaN layer having a constant content of Al element, an AlGaN layer having a content of Al element progressively increased from an interface between the junction termination structure and the barrier layer to a surface of the junction termination structure away from the barrier layer, a n-type GaN layer and a p-type GaN layer.

10. The power semiconductor device according to claim 1, wherein the barrier layer is made of InAlN; and the junction termination structure is any one of an InAlN layer having a constant content of In element, an InAlN layer having a content of In element progressively decreased from an interface between the junction termination structure and the barrier layer to a surface of the junction termination structure away from the barrier layer, a n-type GaN layer and a p-type GaN layer.

11. The power semiconductor device according to claim 1, wherein a groove is provided in a partial region on a side of the barrier layer away from the substrate, at least a partial region of the gate electrode is located above the groove, and a part of the gate electrode metal is filled within the groove.

12. The power semiconductor device according to claim 1, further comprising a gate electrode metal field plate which is provided above at least a partial region of the gate electrode and at least a partial region of the junction termination structure, wherein the gate electrode and the junction termination structure is connected by the gate electrode metal field plate.

13. The power semiconductor device according to claim 1, further comprising a source electrode metal field plate which is provided above at least a partial region of the source electrode and at least a partial region of the junction termination structure, wherein the source electrode and the junction termination structure is connected by the source electrode metal field plate, and an air bridge or a dielectric bridge is formed below the source electrode metal field plate.

14. The power semiconductor device according to claim 1, wherein a partial region of the junction termination structure is located below the gate electrode.

15. The power semiconductor device according to claim 1, further comprising a capping layer provided above the barrier layer,
   wherein the gate electrode is located above the capping layer, and the junction termination structure extends toward the drain electrode from a side of the capping layer away from the source electrode.

16. A method for manufacturing a power semiconductor device, comprising:
   providing a substrate;
   forming a channel layer on the substrate;
   forming a barrier layer on the channel layer; and
   forming a source electrode, a drain electrode, a gate electrode and a junction termination structure on the barrier layer,
   wherein the gate electrode is located between the source electrode and the drain electrode; and the junction termination structure extends in a first direction from an edge of a side of the gate electrode close to the drain electrode to the drain electrode, the junction termination structure at least comprises a first region close to the gate electrode and a second region away from the gate electrode, and a thickness of the first region is greater than that of the second region in a second direction perpendicular to the barrier layer.

17. The method according to claim 16, wherein a lattice constant of the junction termination structure is greater than that of the barrier layer.

18. The method according to claim 16, wherein forming a junction termination structure on the barrier layer comprises:
- depositing a junction termination layer on the barrier layer and forming a photoresist layer on the junction termination layer; and
- photolithographing and developing the photoresist layer by using a mask having a variable-density dot array, and then performing dry-etching to remove a part of the junction termination layer so as to form the junction termination structure.

19. The method according to claim 18, further comprising gradually increasing an exposure degree of the mask in the first direction to obtain a junction termination structure having a thickness progressively decreased in the first direction.

20. The method according to claim 16, wherein forming a junction termination structure on the barrier layer comprises:
- depositing a junction termination layer on the barrier layer and forming a photoresist layer on the junction termination layer;
- photolithographing and developing the photoresist layer by using a mask, and then performing dry-etching to remove a part of the junction termination layer; and
- reducing a width of an exposure window, and repeating the steps of photolithographing and developing the photoresist layer by using the mask and the step of dry-etching to remove a part of the junction termination layer until the thickness of the first region is greater than that of the second region in a second direction perpendicular to the barrier layer.

\* \* \* \* \*